(12) United States Patent
Kim et al.

(10) Patent No.: US 11,133,315 B2
(45) Date of Patent: Sep. 28, 2021

(54) SEMICONDUCTOR DEVICE AND METHOD OF FABRICATING THE SAME

(71) Applicant: Samsung Electronics Co., Ltd., Suwon-si (KR)

(72) Inventors: Keunnam Kim, Yongin-si (KR); Yoosang Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 16/564,071

(22) Filed: Sep. 9, 2019

(65) Prior Publication Data

US 2020/0105765 A1   Apr. 2, 2020

(30) Foreign Application Priority Data

Oct. 2, 2018  (KR) .......................... 10-2018-0117776

(51) Int. Cl.

| | |
|---|---|
| *H01L 27/108* | (2006.01) |
| *H01L 29/423* | (2006.01) |
| *H01L 21/28* | (2006.01) |
| *H01L 21/311* | (2006.01) |
| *H01L 29/49* | (2006.01) |

(52) U.S. Cl.
CPC .. *H01L 27/10823* (2013.01); *H01L 21/28088* (2013.01); *H01L 21/28176* (2013.01); *H01L 21/31111* (2013.01); *H01L 27/10814* (2013.01); *H01L 27/10876* (2013.01); *H01L 29/42368* (2013.01); *H01L 29/4966* (2013.01)

(58) Field of Classification Search
None
See application file for complete search history.

(56) References Cited

U.S. PATENT DOCUMENTS

| | | | |
|---|---|---|---|
| 6,979,621 B2 | 12/2005 | Hshieh et al. | |
| 7,723,755 B2 | 5/2010 | Lee et al. | |
| 8,242,557 B2 | 8/2012 | Shimada et al. | |
| 8,598,651 B2 | 12/2013 | Oga et al. | |
| 8,889,539 B2 | 11/2014 | Ryu et al. | |
| 9,634,134 B2 | 4/2017 | Ting et al. | |
| 2019/0006235 A1* | 1/2019 | Yin | ........................ H01L 23/535 |
| 2019/0067278 A1* | 2/2019 | Seo | ..................... H01L 29/7851 |

FOREIGN PATENT DOCUMENTS

| | | |
|---|---|---|
| KR | 10-2011-0060732 | 6/2011 |
| KR | 10-1094956 B1 | 12/2011 |
| KR | 10-1096215 B1 | 12/2011 |
| KR | 10-1119138 B1 | 3/2012 |

* cited by examiner

*Primary Examiner* — Hsien Ming Lee
(74) *Attorney, Agent, or Firm* — Muir Patent Law, PLLC

(57) ABSTRACT

Disclosed are semiconductor devices and methods of fabricating the same. The semiconductor device comprises a substrate having a trench, a gate dielectric layer covering a surface of the trench, a gate electrode filling a lower portion of the trench, a capping pattern on the gate electrode in the trench, and a work function control pattern between the gate electrode and the capping pattern in the trench. The gate dielectric layer comprises a first segment having a first thickness between the gate electrode and the trench and a second segment having a second thickness between the capping pattern and the trench. The second thickness is less than the first thickness.

20 Claims, 7 Drawing Sheets

SEMICONDUCTOR DEVICE AND METHOD OF FABRICATING THE SAME

CROSS-REFERENCE TO RELATED APPLICATION

This U.S. nonprovisional application claims the benefit of priority under 35 U.S.C. § 119 to Korean Patent Application No. 10-2018-0117776, filed on Oct. 2, 2018, in the Korean Intellectual Property Office, the entire contents of which are hereby incorporated by reference.

BACKGROUND

The disclosure relates to a semiconductor device and a method of fabricating the same, and more particularly, to a semiconductor device including buried gate lines and a method of fabricating the same.

Semiconductor devices have an important role in the electronic industry because of their small size, multi-functionality, and/or low fabrication cost. Semiconductor devices may be categorized as any one of semiconductor memory devices storing logic data, semiconductor logic devices processing operations of logic data, and hybrid semiconductor devices having both memory and logic elements.

Recently, high speed and low consumption of electronic products require that semiconductor devices embedded in the electronic products should have high operating speed and/or lower operating voltage. For satisfying the above demands, semiconductor devices have been more highly integrated. The high integration of semiconductor devices may cause to reduce the reliability of the semiconductor devices. However, the high reliability of semiconductor devices has been increasingly required with the advance in the electronic industry. Therefore, various research has been conducted for enhancing the reliability of semiconductor devices.

SUMMARY

Some example embodiments of the present inventive concepts provide a semiconductor device with enhanced electrical characteristics and a method of fabricating the same.

An object of the present inventive concepts is not limited to the mentioned above, and other objects which have not been mentioned above will be clearly understood to those skilled in the art from the following description.

According to certain example embodiments, the disclosure is directed to a semiconductor device, comprising: a substrate having a trench; a gate dielectric layer covering a surface of the trench; a gate electrode filling a lower portion of the trench; a capping pattern on the gate electrode in the trench; and a work function control pattern between the gate electrode and the capping pattern in the trench, wherein the gate dielectric layer comprises: a first segment provided between the gate electrode and the trench and having a first thickness; and a second segment provided between the capping pattern and the trench and having a second thickness, the second thickness being less than the first thickness.

According to certain example embodiments, the disclosure is directed to a method of fabricating a semiconductor device, the method comprising: forming a trench in a substrate; forming a gate dielectric layer having a first thickness in the trench; sequentially forming on the gate dielectric layer a gate electrode, a work function control pattern, and a capping pattern, wherein the work function control pattern is formed between the gate electrode and the capping pattern; and controlling the gate dielectric layer to have various thicknesses at different portions of the gate dielectric layer, wherein controlling the gate dielectric layer to have the various thicknesses comprises: after forming the gate electrode and the work function control pattern in the trench, forming the gate dielectric layer to have a second thickness less than the first thickness, wherein the gate dielectric layer having the second thickness is exposed to a first exposure region in the trench.

According to certain example embodiments, the disclosure is directed to a semiconductor device, comprising: a device isolation layer that defines active regions of a substrate; and a gate line structure that intersects the active regions and is buried in a trench of the substrate, wherein the gate line structure comprises: a gate electrode that fills a lower portion of the trench; a work function control pattern on the gate electrode in the trench; a capping pattern on the work function control pattern in the trench; and a gate dielectric layer that extends along a surface of the trench and covers surfaces of the gate electrode, the work function control pattern, and the capping pattern, wherein the gate dielectric layer comprises: a first segment provided between the gate electrode and the trench and having a first thickness; a second segment provided between the capping pattern and the trench and having a second thickness, the second thickness being less than the first thickness; and a third segment provided between the work function control pattern and the trench and having a third thickness, the third thickness being greater than the second thickness.

Details of other example embodiments are included in the description and drawings.

DETAILED DESCRIPTION OF EMBODIMENTS

Figure 1:
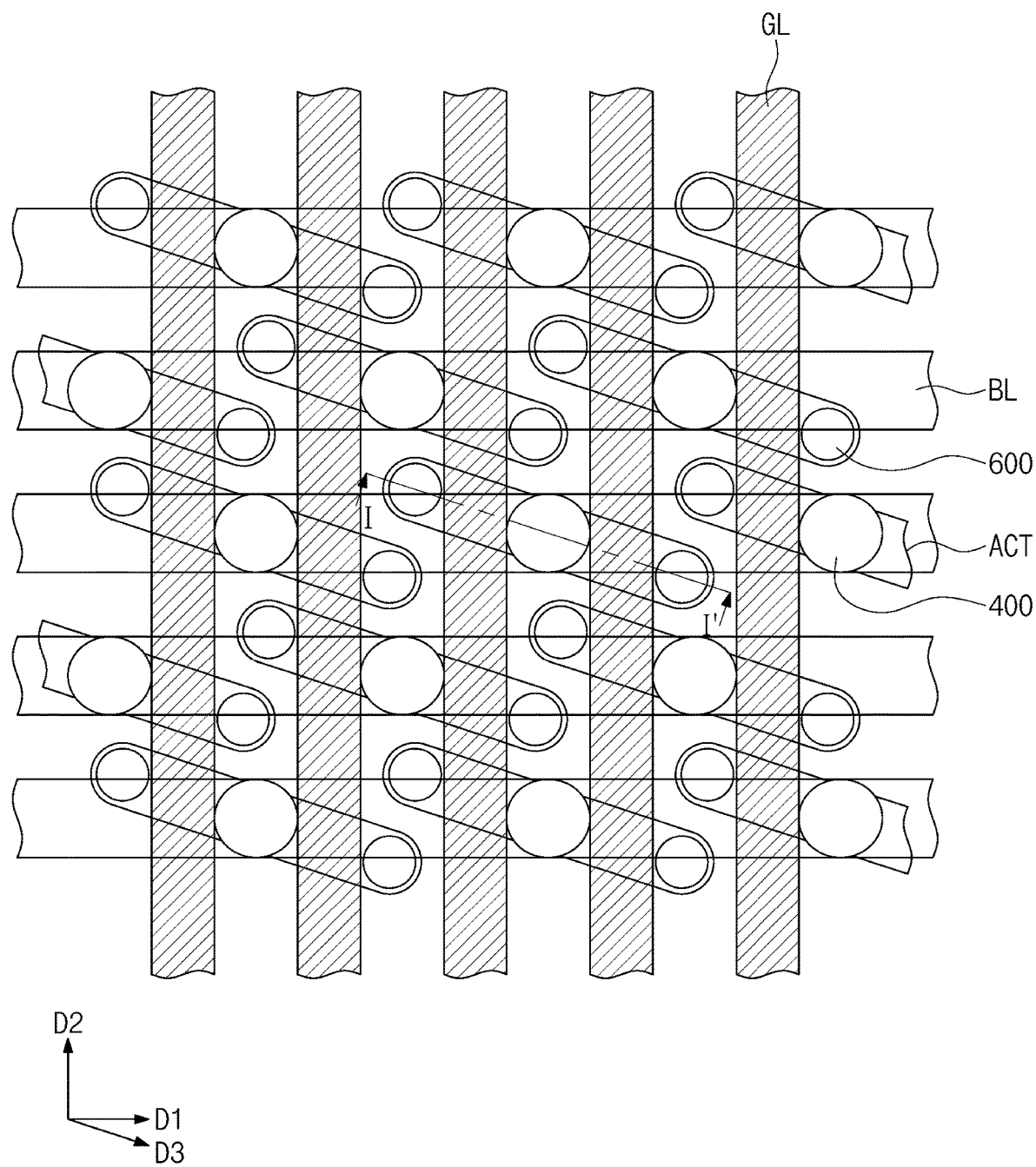
FIG. 1 illustrates a plan view showing a semiconductor device according to some example embodiments of the present inventive concepts.
Figure 2:
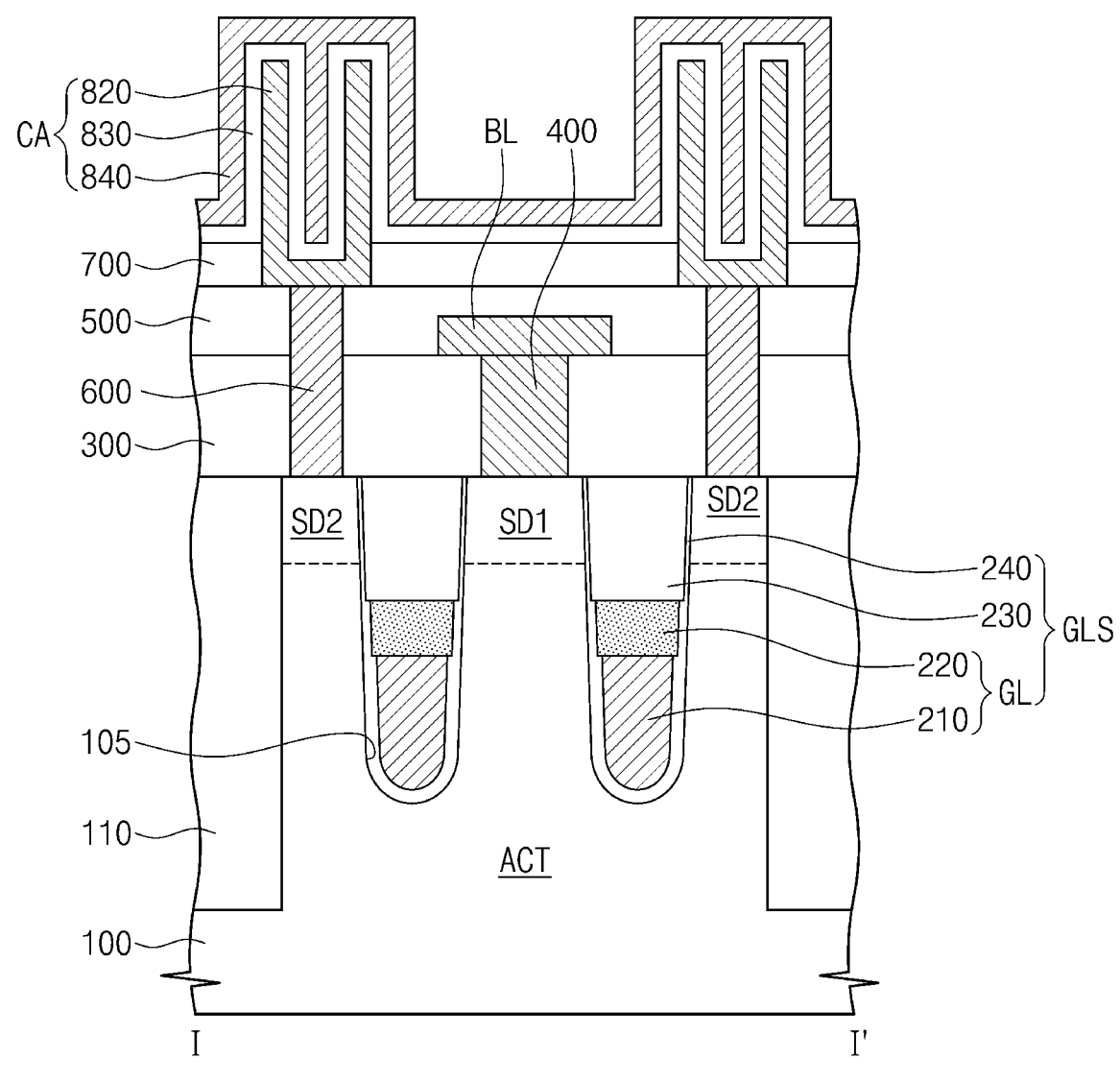
FIG. 2 illustrates a cross-sectional view taken along line I-I' of FIG. 1.

FIG. 1 illustrates a plan view showing a semiconductor device according to some example embodiments of the present inventive concepts. FIG. 2 illustrates a cross-sectional view taken along line I-I' of FIG. 1. A semiconductor device discussed below may be a semiconductor memory device. For example, the semiconductor device may be, but is not limited to, a dynamic random access memory (DRAM). The semiconductor device may include buried gate lines. In some embodiments, when a first structure is "buried" in a layer, the layer may surround at least a portion of the first structure, such as being formed about bottom and side surfaces of the first structure (and top surfaces of the first structure may be coplanar with or below the layer in which it is buried). For example, a first structure may be considered to be buried when it is at least partially embedded in a layer.

The following will now describe an example drawn in a first direction D1, a second direction D2, and a third direction D3, any two of which are arranged on the same plane. The first direction D1 and the second direction D2 may be perpendicular to each other, and the third direction D3 may intersect the first and second directions D1 and D2 at an angle. FIG. 2 illustrates a cross-sectional view along the third direction D3.

Referring to FIGS. 1 and 2, a substrate 100 may be provided therein with a device isolation layer 110 defining active regions ACT. Each of the active regions ACT may have an isolated shape. Each of the active regions ACT may have an elongated bar shape when viewed in plan. For example, when viewed in plan, each of the active regions ACT may have a bar shape extending in the third direction D3. In some embodiments, the bar shape may have rounded corners. The active regions ACT may be portions of the substrate 100 that are surrounded by the device isolation layer 110. For example, when viewed in plan view, each active region ACT may be defined by the surrounding isolation layer 110.

The substrate 100 may include a semiconductor material. For example, the substrate 100 may be a silicon substrate, a germanium substrate, or a silicon-germanium substrate. The device isolation layer 110 may include oxide such as silicon oxide, nitride such as silicon nitride, or oxynitride such as silicon oxynitride.

Figure 3:
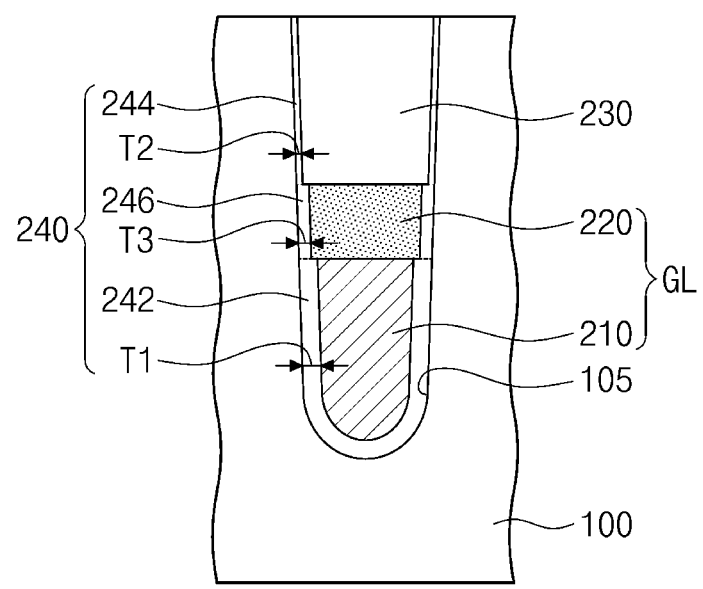
FIG. 3 illustrates an enlarged cross-sectional view showing a gate line structure of FIG. 2.

FIG. 3 illustrates an enlarged cross-sectional view showing a gate line structure GLS of FIG. 2. Referring to FIGS. 2 and 3, a plurality of the gate line structures GLS may run across the active regions ACT. The gate line structure GLS may include a gate line GL, a capping pattern 230, and a gate dielectric layer 240.

The gate line GL may constitute a word line of a semiconductor device. The gate lines GL may be disposed in the substrate 100 such that the gate lines GL may intersect the active regions ACT. In some embodiments, multiple gate lines GL may overlap each active region. In the example of FIGS. 1 and 2, two gate lines GL overlap each active region ACT. The gate lines GL may extend lengthwise in the second direction D2 and may be arranged along the first direction D1. An item, layer, or portion of an item or layer described as extending "lengthwise" in a particular direction has a length in the particular direction and a width perpendicular to that direction, where the length is greater than the width. A lengthwise direction of a wiring pattern (such as gate lines GL) may correspond to the direction of current flow in the wiring pattern. The gate lines GL may be buried in the substrate 100. The gate lines GL may be disposed in trenches 105 of the substrate 100. The trenches 105 may extend to intersect the active regions ACT. Each of the trenches 105 may have a width that decreases as approaching the substrate 100, or as approaching a lower portion of the trench 105. For example, each of the trenches 105 may have a U-shape that is wider at the upper portion and narrower at the lower portion, when viewed in cross-section.

Each of the gate lines GL may include a gate electrode 210 and a work function control pattern 220. The gate electrode 210 may be disposed in the trench 105. The gate electrode 210 may fill a lower portion of the trench 105. The gate electrode 210 may partially gap-fill the trench 105. The gate electrode 210 may have a top surface at a lower level than that of a top surface of the substrate 100. The gate electrode 210 may include metal, such as tungsten (W), copper (Cu), titanium (Ti), or tantalum (Ta).

The work function control pattern 220 may lie on the gate electrode 210 and may partially fill the trench 105. The work function control pattern 220 may be interposed between the gate electrode 210 and the capping pattern 230. When viewed in plan view, the work function control pattern 220 may overlap the gate electrode 210. For example, each of the gate electrode 210 and the work function control pattern 220 may extend in the second direction D2. The work function control pattern 220 may cover a top surface of the gate electrode 210. The work function control pattern 220 may have a width greater than the width of the gate electrode 210, when viewed in cross-section. The work function control pattern 220 may have a top surface at a lower level than that of the top surface of the substrate 100. The work function control pattern 220 may have a work function less than that of the gate electrode 210. The work function control pattern 220 may include a material doped with N-type impurities. For example, the work function control pattern 220 may include polysilicon doped with N-type impurities. Although not shown, a barrier layer may be provided between the work function control pattern 220 and the gate electrode 210.

The capping pattern 230 may be disposed on the gate line GL. The capping pattern 230 may fill a remaining portion of the trench 105. The capping pattern 230 may have a width greater than the width of the work function control pattern 220, when viewed in cross-section. The capping pattern 230 may have a top surface coplanar with that of the substrate 100. For example, the top surface of the capping pattern 230 may be located at the same level as that of the top surface of the substrate 100. The capping pattern 230 may include a silicon oxide layer, a silicon nitride layer, or a silicon oxynitride layer. The capping pattern 230 may have opposite lateral surfaces in contact with the active regions ACT and the device isolation layer 110.

The gate dielectric layer 240 may be provided along a surface of the trench 105. The gate dielectric layer 240 may extend along the trench 105 and may contact side surfaces of the gate line GL and the capping pattern 230. The gate dielectric layer 240 may be interposed between the gate line GL and the active region ACT, between the gate line GL and the device isolation layer 110, between the capping pattern 230 and the active region ACT, and between the capping pattern 230 and the device isolation layer 110. The gate dielectric layer 240 interposed between the capping pattern 230 and the active region ACT may serve as a buffer that reduces stress between the capping pattern 230 and the active region ACT. The gate dielectric layer 240 may include oxide, nitride, or oxynitride.

The gate dielectric layer 240 may include segments whose thicknesses are different from each other. For example, the gate dielectric layer 240 may include a first segment 242, a second segment 244, and a third segment 246. The first segment 242 may be a first portion of the gate dielectric layer 240 formed between the gate electrode 210 and the trench 105. The first segment 242 may have a first thickness T1. The second segment 244 may be a second portion of the gate dielectric layer 240 formed between the capping pattern 230 and the trench 105. The second segment 244 may have a second thickness T2. The second thickness T2 may be less than the first thickness T1. For example, the second thickness T2 may be about 40% to about 60% of the first thickness T1. The third segment 246 may be a third portion of the gate dielectric layer 240 formed between the work function control pattern 220 and the trench 105. The third segment 246 may be interposed between the first segment 242 and the second segment 244. The third segment 246 may have a third thickness T3. The third thickness T3 may be different from the first thickness T1 and the second thickness T2. The third thickness T3 may be less than the first thickness T1 and equal to or greater than the second thickness T2. For example, the third thickness T3 may be about 60% to about 80% of the first thickness T1.

Referring back to FIGS. 1 and 2, a first doping region SD1 and a second doping region SD2 may be disposed in the active region ACT on opposite sides of each gate line GL. The first and second doping regions SD1 and SD2 may extend into the substrate 100 from the top surface of the substrate 100. The first and second doping regions SD1 and SD2 may have a conductive type different from that of the substrate 100. For example, when the substrate 100 is P-type, the first and second doping regions SD1 and SD2 may be N-type. The first doping region SD1 and the second doping region SD2 may respectively correspond to a source region or a drain region.

A first interlayer dielectric layer 300 may be disposed on the substrate 100 and the device isolation layer 110. The first interlayer dielectric layer 300 may include a silicon oxide layer, a silicon nitride layer, or a silicon oxynitride layer.

Bit lines BL may be disposed on the first interlayer dielectric layer 300. The bit lines BL may be connected to the first doping regions SD1 through first contacts 400 that penetrate the first interlayer dielectric layer 300. The bit lines BL may include a conductive material such as metal or doped silicon. The first contact 400 may be a bit line contact. The first contact 400 may electrically connect the first doping region SD1 to the bit line BL. Although not shown, the first contact 400 may have a structure in which a portion (e.g., a lower portion) of the first contact 400 is recessed into the substrate 100. For example, a bottom surface of the first contact 400 may be lower than the top surface of the substrate 100.

A second interlayer dielectric layer 500 may be disposed on the first interlayer dielectric layer 300 and the bit lines BL. The second interlayer dielectric layer 500 may cover the bit lines BL. The second interlayer dielectric layer 500 may include a silicon oxide layer, a silicon nitride layer, or a silicon oxynitride layer.

The substrate 100 may be provided thereon with a second contact 600 that penetrates the first and second interlayer dielectric layers 300 and 500 and contacts the second doping region SD2. The second contact 600 may include a conductive material, such as metal or doped silicon. The second contact 600 may be a storage node contact. The second contact 600 may electrically connect the second doping region SD2 to a capacitor CA which will be discussed below. Although not shown, the second contact 600 may have a structure in which a portion (e.g., a lower portion) of the second contact 600 is recessed into the substrate 100. For example, a bottom surface of the second contact 600 may be lower than the top surface of the substrate 100.

The second interlayer dielectric layer 500 may be provided thereon with a data storage element connected to the second contact 600. For example, the data storage element may be a capacitor CA including a first electrode 820, a second electrode 840, and a dielectric layer 830 between the first and second electrodes 820 and 840. The first electrode 820 may have a cylindrical shape whose bottom is closed. The second electrode 840 may cover the first electrode 820. The second electrode 840 may have a portion that extends within the area formed by the inner sidewall of the first electrode 820. The first electrode 820 and the second electrode 840 may each include doped silicon, metal, or metal compound.

A support layer 700 may be disposed between the second electrode 840 and the second interlayer dielectric layer 500. For example, the support layer 700 may be disposed between the dielectric layer 830 and the second interlayer dielectric layer 500. The support layer 700 may contact a lower surface of an outer sidewall of the first electrode 820 and may prevent collapse of the first electrode 820. The support layer 700 may include a dielectric material.

According to some example embodiments of the present inventive concepts, the gate dielectric layer 240 may be configured in such a way that the second segment 244 adjacent to the capping pattern 230 may be provided thinner than the first segment 242 adjacent to the gate electrode 210. Therefore, the capping pattern 230 may be relatively expanded enough to effectively insulate contacts, especially storage node contacts, from each other. In contrast, when the gate dielectric layer 240 is provided to have a uniform thickness, an occupied area of the capping pattern 230 may be reduced to result in poor insulation between contacts. For example, the increased width of the capping pattern 230 relative to the width of the word lines WL may improve insulation between first contacts 400 and second contacts 600.

In addition, the gate dielectric layer 240 may be configured in such a way that the third segment 246 adjacent to the work function control pattern 220 may be provided thinner than the first segment 242 adjacent to the gate electrode 210. Thus, the work function control pattern 220 may be relatively expanded to control a work function and to reduce a gate induced drain leakage (GIDL) current that flows from the gate line GL to the doping regions SD1 and SD2. For example, the increased width of the work function control pattern 220 relative to the width of the gate electrode 210 may improve control of a work function and reduce the GIDL current that flows from the gate line GL to the doping regions SD1 and SD2. As a result, a semiconductor device according to the present inventive concepts may improve in electrical characteristics.

FIGS. 4A to 4D illustrate cross-sectional views showing a method of fabricating a gate line structure according to some example embodiments of the present inventive concepts. A semiconductor device may be fabricated by the following steps: forming a trench 105 on a substrate 100; forming a gate dielectric layer 240 in the trench 105; sequentially forming on the gate dielectric layer 240 a gate electrode 210 that partially fills the trench 105, a work function control pattern 220, and a capping pattern 230, where the work function control pattern 220 that is interposed between the gate electrode 210 and the capping pattern 230; and controlling the gate dielectric layer 240 to have various thicknesses at its different segments. When appropriate, the control of the thickness of the gate dielectric layer 240 may be followed by at least one of the formation of the gate electrode 210, the formation of the capping pattern 230, and the formation of the work function control pattern 220 between the gate electrode 210 and the capping pattern 230. The following will describe a method of fabricating a semiconductor device in conjunction with FIGS. 2, 3, and 4A to 4D.

Referring to FIG. 2, a device isolation layer 110 may be formed in the substrate 100, defining active regions ACT of the substrate 100. The device isolation layer 110 may include a silicon nitride layer, a silicon oxide layer, or a silicon oxynitride layer. The device isolation layer 110 may be formed to extend into the substrate 100. For example, the device isolation layer 110 may be formed to extend below a top surface of the substrate 100. Second doping regions SD2 may be formed in the active regions ACT of the substrate 100. An ion implantation process may be employed to form the second doping regions SD2. The second doping regions SD2 may be areas doped with N-type impurities.

Figure 4A:
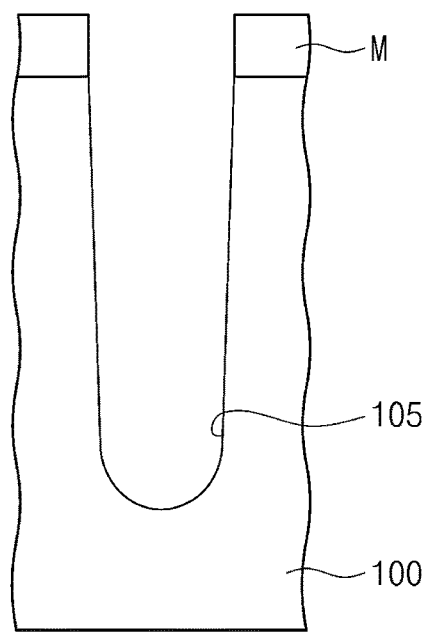
FIGS. 4A to 4D illustrate cross-sectional views showing a method of fabricating a gate line structure according to some example embodiments of the present inventive concepts.

Referring to FIG. 4A, the trench 105 may be formed in the substrate 100. For example, a mask pattern M may be formed on the substrate 100, and then the mask pattern M may be used as an etching mask to etch the substrate 100 to form the trench 105. For brevity of drawings, FIGS. 4A to 4D show an example including a single trench 105. The trench 105 may have a linear shape extending in a second direction D2. The trench 105 may have a bottom surface that exposes the device isolation layer 110 and the active region ACT. The mask pattern M may be removed after the etching process is performed.

Figure 4B:
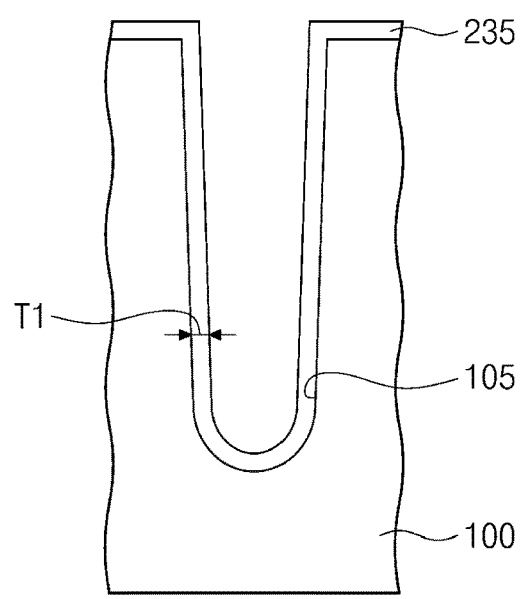

Referring to FIG. 4B, a preliminary gate dielectric layer 235 may be formed on the substrate 100 in which the trench 105 is formed. The preliminary gate dielectric layer 235 may be formed to have a first thickness T1. The preliminary gate dielectric layer 235 may be formed using a thermal oxidation process, an atomic layer deposition (ALD) process, or a chemical vapor deposition (CVD) process. The preliminary gate dielectric layer 235 may cover a top surface of the substrate 100, and also cover the bottom surface and an inner sidewall of the trench 105. The preliminary gate dielectric layer 235 may include a silicon oxide layer.

Figure 4C:
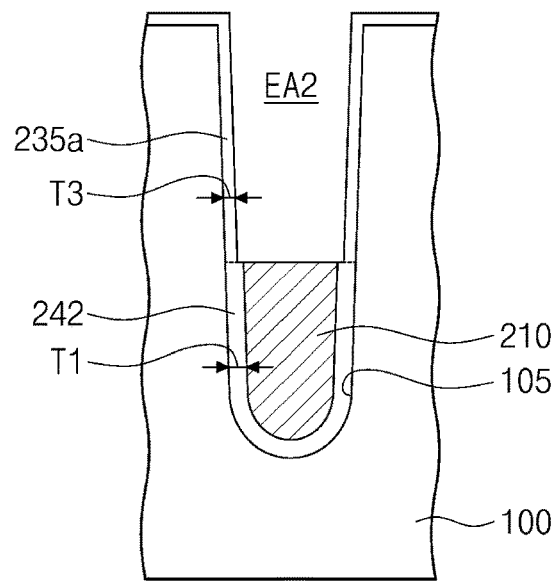

Referring to FIG. 4C, the gate electrode 210 may be formed in the trench 105. The gate electrode 210 may be formed in a lower portion of the trench 105 in which the preliminary gate dielectric layer 235 is formed. For example, a conductive material (not shown) may be deposited on an entire surface of the substrate 100 on which the preliminary gate dielectric layer 235 is formed. The conductive material may fill the trench 105. The conductive material may be deposited using a chemical vapor deposition (CVD) or the like. The conductive material may include metal, such as tungsten (W), copper (Cu), titanium (Ti), or tantalum (Ta). The deposited conductive material may be etched to form the gate electrode 210. The conductive material may be etched by, for example, an etch-back process. The etching process may continue until the gate electrode 210 has a desirable thickness (e.g., height in the vertical direction).

When the gate electrode 210 is formed, a portion of the preliminary gate dielectric layer (see, e.g., preliminary gate dielectric layer 235 of FIG. 4B) may be exposed to a second exposure area EA2 in the trench 105. The second exposure area EA2 may be a space above the gate electrode 210 in the trench 105. A first segment 242 of a gate dielectric layer (see, e.g., gate dielectric layer 240 of FIG. 3) may be formed between the gate electrode 210 and the trench 105. The first segment 242 may have the first thickness T1.

A preliminary gate dielectric layer 235a having a third thickness T3 may be formed in the second exposure area EA2. The preliminary gate dielectric layer (see, e.g., preliminary gate dielectric layer 235 of FIG. 4B) may be selectively etched to have the third thickness T3. The preliminary gate dielectric layer 235 may be isotropically etched. The third thickness T3 may be less than the first thickness T1. For example, the third thickness T3 may be about 60% to about 80% of the first thickness T1. A wet etching process may be used to thin the preliminary gate dielectric layer 235, but the present inventive concepts are not limited thereto.

Alternatively, the formation of the preliminary gate dielectric layer 235a having the third thickness T3 may include removing the preliminary gate dielectric layer (see, e.g., preliminary gate dielectric layer 235 of FIG. 4B) exposed to the second exposure area EA2, and then depositing a dielectric layer to have the third thickness T3 in the second exposure area EA2 of the trench 105.

Figure 4D:
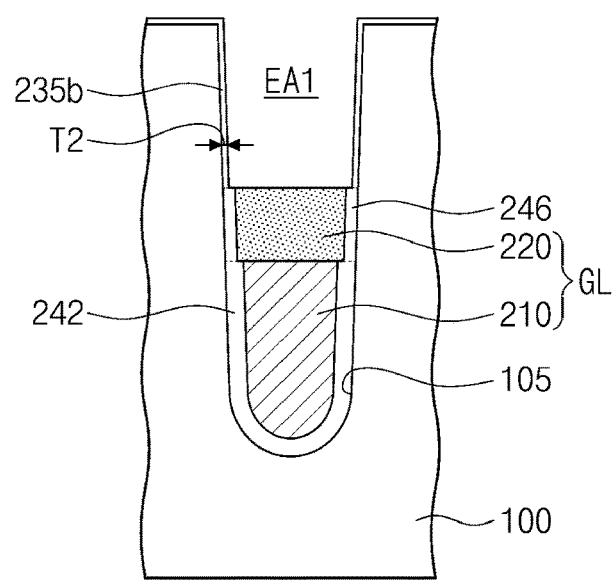

Referring to FIG. 4D, the work function control pattern 220 may be formed on the gate electrode 210. For example, polysilicon (not shown) may be deposited on the entire surface of the substrate 100. The polysilicon may fill the trench 105. The polysilicon may be formed using a chemical vapor deposition (CVD) or the like. The deposited polysilicon may be etched and doped with N-type impurities to form the work function control pattern 220. The work function control pattern 220 may be etched by an etch-back process. The etching process may continue until the work function control pattern 220 has a desirable thickness (e.g., height in the vertical direction). The gate electrode 210 and the work function control pattern 220 may constitute a gate line GL.

When the work function control pattern 220 is formed, a portion of the preliminary gate dielectric layer (see, e.g., preliminary gate dielectric layer 235a of FIG. 4C) may be exposed to a first exposure area EA1 in the trench 105. The first exposure area EA1 may be a space above the work function control pattern 220 in the trench 105. A third segment 246 of a gate dielectric layer (see, e.g., gate dielectric layer 240 of FIG. 3) may be formed between the work function control pattern 220 and the trench 105. The third segment 246 may have the third thickness T3.

A preliminary gate dielectric layer 235b having a second thickness T2 may be formed in the first exposure area EA1. The preliminary gate dielectric layer (see, e.g., preliminary gate dielectric layer 235a of FIG. 4C) exposed to the first exposure area EA1 may be selectively etched to have the second thickness T2. The preliminary gate dielectric layer 235a may be isotropically etched. The second thickness T2 may be less than the first thickness T1 and the third thickness T3. For example, the second thickness T2 may be about 40% to about 60% of the first thickness T1. A wet etching process may be used to thin the preliminary gate dielectric layer 235a, but the present inventive concepts are not limited thereto.

Alternatively, the formation of the preliminary gate dielectric layer 235b having the second thickness T2 may include removing the preliminary gate dielectric layer (see, e.g., preliminary gate dielectric layer 235a of FIG. 4C) exposed to the first exposure area EA1, and then depositing a dielectric layer to have the second thickness T2 in the first exposure area EA1 of the trench 105.

Referring back to FIG. 3, the capping pattern 230 may be formed in the trench 105. For example, the capping pattern 230 may be formed by forming a capping layer on the entire surface of the substrate 100, and then a planarization process may be performed on the capping layer. The capping pattern 230 may include one of a silicon nitride layer, a silicon oxide layer, and a silicon oxynitride layer. In this step, the planarization process may remove a portion of the preliminary gate dielectric layer 235b from the top surface of the substrate 100, and a remaining preliminary gate dielectric layer 235b may be formed into a second segment 244 of a gate dielectric layer 240 which will be discussed below. Therefore, a gate dielectric layer 240 may be formed between the gate line GL and the active region (see, e.g., active region ACT of FIG. 2) and/or between the gate line GL and the device isolation layer (see, e.g., device isolation layer 110 of FIG. 2). An etching process (e.g., the planarization process) may be performed to expose a top surface of the device isolation layer 110 and top surfaces of the active regions ACT.

As discussed above, the gate dielectric layer 240 may include segments whose thicknesses are different from each other. The gate dielectric layer 240 may include the first segment 242, the second segment 244, and the third segment 246. The first segment 242 may be a first portion of the gate dielectric layer 240, where the first portion is formed between the gate electrode 210 and the trench 105. The first segment 242 may have the first thickness T1. The second segment 244 may be second portion of the gate dielectric layer 240, where the second portion is formed between the capping pattern 230 and the trench 105. The second segment 244 may have the second thickness T2. The second thickness T2 may be less than the first thickness T1. For example, the second thickness T2 may be about 40% to about 60% of the first thickness T1. The third segment 246 may be a third portion of the gate dielectric layer 240, where the third portion is formed between the work function control pattern 220 and the trench 105. The third segment 246 may be interposed between the first segment 242 and the second segment 244. The third segment 246 may have the third thickness T3. The third thickness T3 may be less than the first thickness T1 and greater than the second thickness T2. For example, the third thickness T3 may be about 60% to about 80% of the first thickness T1.

Referring back to FIG. 2, the substrate 100 may undergo an ion implantation process to form a first doping region SD1 in an area between two neighboring gate lines GL. The first doping region SD1 may be doped to have the same N-type conductive type as that of the second doping region SD2. The first doping region SD1 may extend further than the second doping region SD2 into the substrate 100.

A first interlayer dielectric layer 300 may be formed on the substrate 100. The first interlayer dielectric layer 300 may be formed using a chemical vapor deposition (CVD) or the like. The first interlayer dielectric layer 300 may be partially patterned to form contact holes (not shown) that defines areas in which are formed first contacts 400, which will be discussed below. A conductive material filling the contact holes may be deposited on the first interlayer dielectric layer 300, and then patterned to form first contacts 400 and bit lines BL. The first contact 400 may be a bit line contact. The first contact 400 may electrically connect the first doping region SD1 to the bit line BL. Although not shown, the first contact 400 may have a structure in which a portion (e.g., a lower portion) of the first contact 400 is recessed into the substrate 100. In addition, although not shown, spacers may be formed to cover sidewalls of the bit lines BL.

A second interlayer dielectric layer 500 may be formed on the first interlayer dielectric layer 300, and second contacts 600 may be formed to penetrate the second interlayer dielectric layer 500 and the first interlayer dielectric layer 300. The second contact 600 may be a storage node contact. The second contact 600 may electrically connect the second doping region SD2 to a capacitor CA which will be discussed below. Although not shown, the second contact 600 may have a structure in which a portion (e.g., a lower portion) of the second contact 600 is recessed into the substrate 100.

A support layer 700 may be formed on the second interlayer dielectric layer 500. The support layer 700 may be formed using a chemical vapor deposition (CVD) or the like. First electrodes 820 may be formed to penetrate the support layer 700 and to have connection with the second contacts 600. A dielectric layer 830 may be formed to conformally cover the first electrodes 820, and a second electrode 840 may be formed to cover the dielectric layer 830, with the result that a capacitor CA may be formed. The processes above may fabricate a semiconductor device according to some example embodiment of the present inventive concepts.

Figure 5:
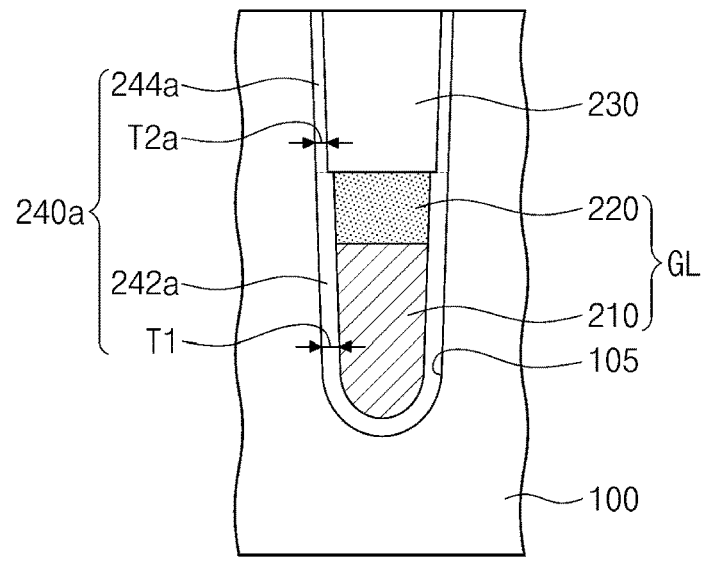
FIG. 5 illustrates a cross-sectional view showing a gate line structure according to some example embodiments of the present inventive concepts.

FIG. 5 illustrates a cross-sectional view showing a gate line structure GLSa according to some example embodiments of the present inventive concepts. The gate line structure GLSa may include a gate electrode 210, a work function control pattern 220, a capping pattern 230, and a gate dielectric layer 240a. In the embodiment that follows, components the same as or similar to the gate electrode 210, the work function control pattern 220, and the capping pattern 230 of the gate line structure GLS discussed with reference to FIGS. 2 and 3 will be allocated the same reference numerals thereto, and repetitive explanations will be omitted.

The gate dielectric layer 240a of the gate line structure GLSa may include a first segment 242a and a second segment 244a. The first segment 242a may be provided between the gate electrode 210 and the trench 105 and between the work function control pattern 220 and the trench 105. The first segment 242a may have the first thickness T1 discussed above. The second segment 244 may be provided between the capping pattern 230 and the trench 105. The second segment 244a may have a second thickness T2a identical to the third thickness T3 discussed above. For example, the second thickness T2a may be about 60% to about 80% of the first thickness T1.

Figure 6:
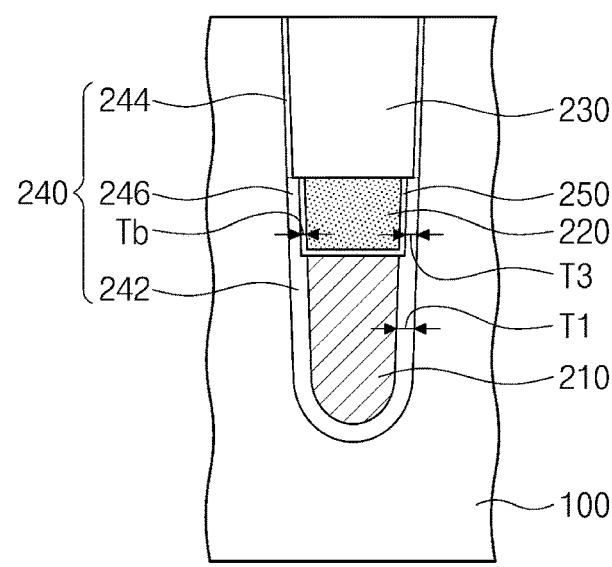
FIG. 6 illustrates a cross-sectional view showing a gate line structure according to some example embodiments of the present inventive concepts.

FIG. 6 illustrates a cross-sectional view showing a gate line structure GLSb according to some example embodiments of the present inventive concepts. The gate line structure GLSb may include a gate electrode 210, a work function control pattern 220, a capping pattern 230, and a gate dielectric layer 240. The gate dielectric layer 240 may include a first segment 242 having a first thickness T1, a second segment 244 having a second thickness T2, and a third segment 246 having a third thickness T3. In the embodiment that follows, components the same as or similar to the gate electrode 210, the work function control pattern 220, the capping pattern 230, and the gate dielectric layer 240 of the gate line structure GLS discussed with reference to FIGS. 2 and 3 will be allocated the same reference numerals thereto, and repetitive explanations will be omitted.

The gate line structure GLSb may further include a liner layer 250. The liner layer 250 may be provided to lie in the trench 105 and to surround the work function control pattern 220. For example, the liner layer 250 may be provided between the gate electrode 210 and the work function control pattern 220 and between the work function control pattern 220 and the third segment 246 of the gate dielectric layer 240. For example, the liner layer 250 may cover bottom and side surfaces of the work function control pattern 220. The liner layer 250 may have a thickness Tb, and a sum of the thickness Tb and the third thickness T3 may be the same as the first thickness T1 of the first segment 242. The liner layer 250 may include metal or metal nitride.

Figure 7:
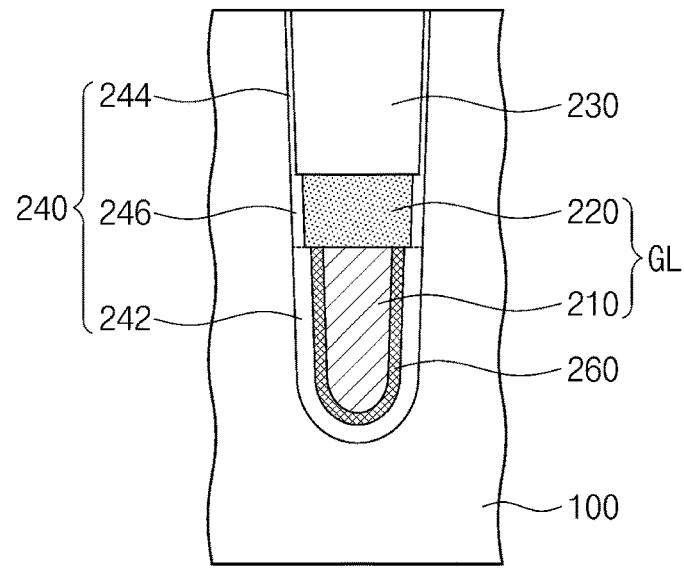
FIG. 7 illustrates a cross-sectional view showing a gate line structure according to some example embodiments of the present inventive concepts.

FIG. 7 illustrates a cross-sectional view showing a gate line structure GLSc according to some example embodiments of the present inventive concepts. The gate line structure GLSc may include a gate electrode 210, a work function control pattern 220, a capping pattern 230, and a gate dielectric layer 240. The gate dielectric layer 240 may include a first segment 242 having a first thickness T1, a second segment 244 having a second thickness T2, and a third segment 246 having a third thickness T3. In the embodiment that follows, components the same as or similar to the gate electrode 210, the work function control pattern 220, the capping pattern 230, and the gate dielectric layer 240 of the gate line structure GLS discussed with reference to FIGS. 2 and 3 will be allocated the same reference numerals thereto, and repetitive explanations will be omitted.

The gate line structure GLSc may further include a barrier layer 260. The barrier layer 260 may be provided to cover a lower portion of an inner sidewall of the trench 105 and to surround the gate electrode 210. For example, the barrier layer 260 may cover bottom and side surfaces of the gate electrode 210. The barrier layer 260 may include oxide or nitride.

Figure 8:
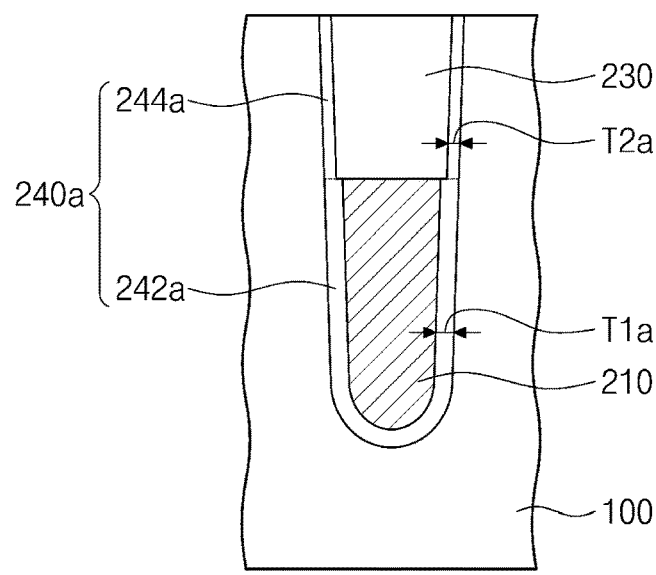
FIG. 8 illustrates a cross-sectional view showing a gate line structure according to some example embodiments of the present inventive concepts.

FIG. 8 illustrates a cross-sectional view showing a gate line structure GLSd according to some example embodiments of the present inventive concepts. The gate line structure GLSd may include a gate electrode 210, a capping pattern 230, and a gate dielectric layer 240a. In the embodiment that follows, components the same as or similar to those of the gate line structure GLS discussed with reference to FIGS. 2 and 3 and those of the gate line structure GLSa discussed with reference to FIG. 5 will be allocated the same reference numerals thereto, and repetitive explanations will be omitted. The gate line structure GLSd may include no work function control pattern.

The gate dielectric layer 240a may include oxide, nitride, or oxynitride. The gate dielectric layer 240a may include segments whose thicknesses are different from each other. For example, the gate dielectric layer 240a may include a first segment 242a and a second segment 244a. The first segment 242a may be a first portion of the gate dielectric layer 240a formed between the gate electrode 210 and the trench 105. The first segment 242a may have a first thickness T1a. The second segment 244a may be a second portion of the gate dielectric layer 240a formed between the capping pattern 230 and the trench 105. The second segment 244a may have a second thickness T2a. The second thickness T2a may be less than the first thickness T1a. For example, the second thickness T2a may be about 40% to about 60% of the first thickness T1a.

According to some example embodiments of the present inventive concepts, there may be provided semiconductor devices with improved electrical characteristics and methods of fabricating the same.

The effects of the present inventive concepts are not limited to the aforementioned effects. Other effects, which are not mentioned above, will be apparently understood by one skilled in the art from the foregoing description and accompanying drawings.

These embodiments herein are presented to facilitate understanding of the present inventive concepts and should not limit the scope of the present inventive concepts, and it is intended that the present inventive concepts cover the various combinations, the modifications, and variations. The technical protection scope of the present inventive concepts will be defined by the technical spirit of the appended claims, and is intended to include all modifications and equivalent substantially falling within the spirit and scope of the invention while not being limited by literary descriptions in the appended claims.

What is claimed is:

1. A semiconductor device, comprising:
    a substrate having a trench;
    a gate dielectric layer covering a surface of the trench;
    a gate electrode filling a lower portion of the trench;
    a capping pattern on the gate electrode in the trench; and
    a work function control pattern between the gate electrode and the capping pattern in the trench,
    wherein the gate dielectric layer comprises:
        a first segment provided between the gate electrode and the trench and having a first thickness; and
        a second segment provided between the capping pattern and the trench and having a second thickness, the second thickness being less than the first thickness, and
    wherein the gate dielectric layer comprises silicon oxide, silicon nitride, or silicon oxynitride.

2. The semiconductor device of claim 1, wherein the gate dielectric layer further comprises:
    a third segment provided between the work function control pattern and the trench and having a third thickness,
    wherein the third thickness is different from the first thickness and the second thickness.

3. The semiconductor device of claim 2, wherein the third thickness is less than the first thickness and equal to or greater than the second thickness.

4. The semiconductor device of claim 3,
    wherein the second thickness is 40% to 60% of the first thickness, and
    wherein the third thickness is 60% to 80% of the first thickness.

5. The semiconductor device of claim 2, further comprising:
    a liner layer surrounding the work function control pattern in the trench,
    wherein a sum of a thickness of the liner layer and the third thickness is equal to the first thickness.

6. The semiconductor device of claim 1, wherein the gate dielectric layer further comprises:
    a third segment provided between the work function control pattern and the trench and having a third thickness,
    wherein the third thickness is equal to the second thickness.

7. The semiconductor device of claim 6, wherein the second thickness is 60% to 80% of the first thickness.

8. The semiconductor device of claim 1, further comprising a barrier layer surrounding the gate electrode in the trench.

9. The semiconductor device of claim 1, wherein a work function of the work function control pattern is less than a work function of the gate electrode.

10. The semiconductor device of claim 1, wherein the work function control pattern comprises a material doped with N-type impurities.

11. The semiconductor device of claim 1,
    wherein the work function control pattern comprises polysilicon doped with N-type impurities, and
    wherein the gate electrode comprises one of Ta, Cu, W, and Ti.

12. A method of fabricating a semiconductor device, the method comprising:
forming a trench in a substrate;
forming a gate dielectric layer having a first thickness in the trench;
sequentially forming on the gate dielectric layer a gate electrode, a work function control pattern, and a capping pattern, wherein the work function control pattern is formed between the gate electrode and the capping pattern; and
controlling the gate dielectric layer to have various thicknesses at different portions of the gate dielectric layer,
wherein controlling the gate dielectric layer to have the various thicknesses comprises:
after forming the gate electrode and the work function control pattern in the trench, forming the gate dielectric layer to have a second thickness less than the first thickness, wherein the gate dielectric layer having the second thickness is exposed to a first exposure region in the trench.

13. The method of claim 12, wherein forming the gate dielectric layer to have the second thickness comprises selectively etching a portion of the gate dielectric layer exposed to the first exposure region.

14. The method of claim 12, wherein forming the gate dielectric layer to have the second thickness comprises:
removing the gate dielectric layer exposed to the first exposure region; and
depositing a dielectric layer to have the second thickness in the trench of the first exposure region from which the gate dielectric layer is removed.

15. The method of claim 12, wherein controlling the gate dielectric layer to have the various thicknesses further comprises:
after forming the gate electrode in the trench, etching the gate dielectric layer to have a third thickness less than the first thickness, wherein the gate dielectric layer having the third thickness is exposed to a second exposure region in the trench.

16. The method of claim 15,
wherein the second exposure region comprises the first exposure region, and
wherein the second thickness is less than the third thickness.

17. The method of claim 16,
wherein the second thickness is 40% to 60% of the first thickness, and
wherein the third thickness is 60% to 80% of the first thickness.

18. The method of claim 12,
wherein the work function control pattern comprises polysilicon doped with N-type impurities, and
wherein the gate electrode comprises one of Ta, Cu, W, and Ti.

19. A semiconductor device, comprising:
a device isolation layer that defines active regions of a substrate; and
a gate line structure that intersects the active regions and is buried in a trench of the substrate,
wherein the gate line structure comprises:
a gate electrode that fills a lower portion of the trench;
a work function control pattern on the gate electrode in the trench;
a capping pattern on the work function control pattern in the trench; and
a gate dielectric layer that extends along a surface of the trench and covers surfaces of the gate electrode, the work function control pattern, and the capping pattern,
wherein the gate dielectric layer comprises:
a first segment provided between the gate electrode and the trench and having a first thickness;
a second segment provided between the capping pattern and the trench and having a second thickness, the second thickness being less than the first thickness; and
a third segment provided between the work function control pattern and the trench and having a third thickness, the third thickness being greater than the second thickness, and
wherein the gate dielectric layer comprises silicon oxide, silicon nitride, or silicon oxynitride.

20. The semiconductor device of claim 19,
wherein the second thickness is 40% to 60% of the first thickness, and
wherein the third thickness is 60% to 80% of the first thickness.

* * * * *